United States Patent [19]
Yeh

[11] Patent Number: 5,706,169
[45] Date of Patent: Jan. 6, 1998

[54] COOLING APPARATUS FOR A COMPUTER CENTRAL PROCESSING UNIT

[76] Inventor: Robin Yeh, Room 2, 6th Fl., No. 285, Sec. 1, Chung Shan Rd., Lu Chou Hsiang, Taipei Hsien, Taiwan

[21] Appl. No.: 648,249

[22] Filed: May 15, 1996

[51] Int. Cl.[6] .............................. H01L 23/36; H05K 7/20
[52] U.S. Cl. .................... 361/690; 361/697; 165/80.3; 165/120
[58] Field of Search ................................ 165/80.3, 120, 165/185, 121; 361/697, 704, 690

[56] References Cited

U.S. PATENT DOCUMENTS

| | | | |
|---|---|---|---|
| 3,180,404 | 4/1965 | Nelson et al. | 165/185 |
| 4,884,631 | 12/1989 | Rippel | 165/185 |
| 5,353,863 | 10/1994 | Yu | 165/80.3 |
| 5,494,098 | 2/1996 | Morosas | 165/121 |
| 5,509,465 | 4/1996 | Lai | 165/80.3 |
| 5,519,574 | 5/1996 | Kodama et al. | 361/697 |

*Primary Examiner*—Allen J. Flanigan
*Attorney, Agent, or Firm*—Browdy and Neimark

[57] ABSTRACT

A CPU cooling apparatus comprises a rectangular cooling plate and two corrugated cooling fins. The cooling plate has an underside that is attached to an integrated circuit chip for absorbing heat generated by the IC chip in operation. The cooling fins are mounted on the upper surface of the cooling plate such that the cooling fins are parallel to each other. The cooling fins are provided respectively with a plurality of first cooling ducts contiguous to one another and are further provided therebetween a second cooling duct so as to bring about an increase in the cooling area to enhance the cooling efficiency. The apparatus further comprises a cooling fan and a plurality of cooling ducts which are different in orientation from the first cooling ducts and the second cooling duct for maximizing the cooling effect of the apparatus.

13 Claims, 3 Drawing Sheets

5,706,169

COOLING APPARATUS FOR A COMPUTER CENTRAL PROCESSING UNIT

FIELD OF THE INVENTION

The present invention relates generally to a cooling apparatus intended for use in the central processing unit of a computer system, and more particularly to a cooling apparatus provided with a plurality of cooling fins to maximize the effect of dispersing heat that is generated by the central processing unit.

BACKGROUND OF THE INVENTION

The U.S. Pat. No. 5,353,863 discloses a CPU cooling device, which is composed of a cooling member and a cooling fan. The cooling member is made of an aluminium material by extrusion molding and is made up of a plurality of striplike radiating flanges.

Such a prior art cooling device as described above is defective in design in that it is ineffective in dispersing heat generated by the computer central processing unit in view of the fact that only a limited number of radiating flanges can be made by extrusion molding on a fixed volume of an aluminium material. In other words, the cooling member of the prior art cooling device is incapable of increasing in number the radiating flanges in accordance with an increase in heat generated by the central processing unit. It must be noted here that the enhancement in the performance of the central processing unit often results in an increase in the amount of heat that is generated by the CPU in operation. For this reason, it is therefore readily apparent that the prior art cooling device disclosed in the above-mentioned U.S. patent is far from being adequate to meet the operational requirements of the computer central processing unit.

In addition, the prior art cooling device described above is further defective in design in that it is provided with a plurality of unidirectional ventilation ducts, which compromise the heat-dispersing effect of the cooling fan of the cooling device.

SUMMARY OF THE INVENTION

It is therefore the primary objective of the present invention to provide a computer central processing unit with a cooling apparatus which is superior in the cooling effect to the prior art cooling apparatus.

It is another objective of the present invention to provide a computer central processing unit with a cooling apparatus having a cooling fan capable of dispelling effectively the heat generated by the computer central processing unit.

In keeping with the principle of the present invention, the foregoing objectives of the present invention are attained by a cooling apparatus which is intended for use in a computer central processing unit and is composed of a rectangular cooling plate made of a material having an excellent cooling property. The cooling plate has one face that is attached to an integrated circuit chip for absorbing the heat generated by the integrated circuit chip. The cooling apparatus of the present invention is further composed of at least two cooling fins of a corrugated construction and made of a material having an excellent cooling property. The cooling fins are mounted securely on another face of the cooling plate such that the cooling fins are parallel to each other. Each of two cooling fins has a plurality of first cooling ducts contiguous to one another. Located between two cooling fins is a second cooling duct for bringing about an increase in the cooling area so as to enhance the overall cooling effect of the cooling apparatus of the present invention. The cooling ducts of the cooling apparatus of the present invention are arranged in such a manner that they extend in different directions so as to maximize the effect of dispelling the heat generated by the computer central processing unit.

The cooling apparatus of the present invention is further characterized in design in that it is composed of two or more elastic fastening frames of an inverted U-shaped construction. Each fastening frame is fastened securely with the cooling plate such that the horizontal arm of the fastening frame is in contact with the top of the cooling fin, and that two vertical arms of the fastening frame are held against both longitudinal ends of the cooling fin. The fastening frames are intended to facilitate the mounting of a cooling fan such that the cooling fins are protected from the weight of the cooling fan.

The foregoing objectives, features, functions and advantages of the present invention will be more readily understood upon a thoughtful deliberation of the following detailed description of the embodiments of the present invention in conjunction with the accompanying drawings.

DETAILED DESCRIPTION OF THE INVENTION

Figure 1:
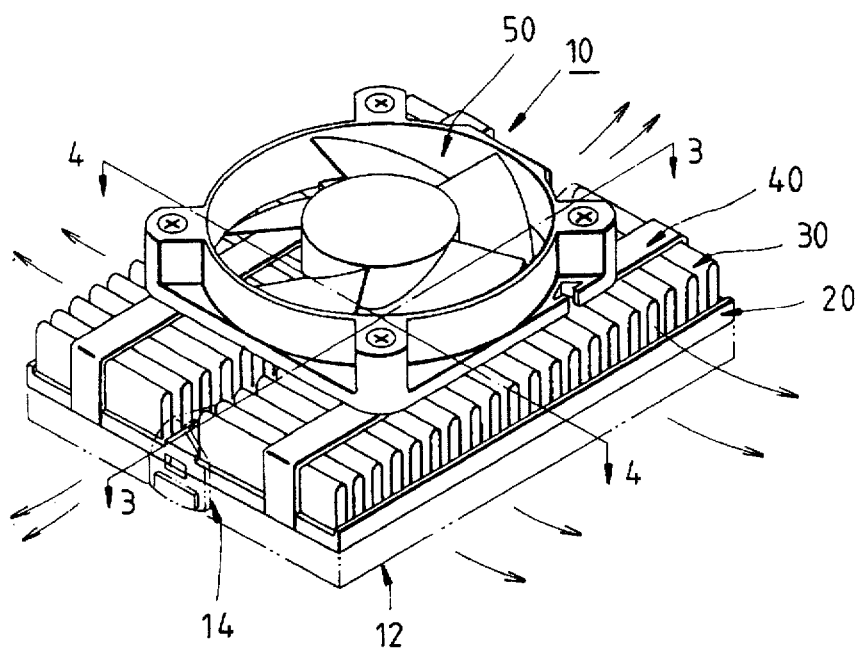
FIG. 1 is a perspective view showing that the cooling apparatus of a first preferred embodiment of the present invention is fastened with an integrated circuit chip (shown by the imaginary lines) by means of a plastic frame and a retaining device.
Figure 3:
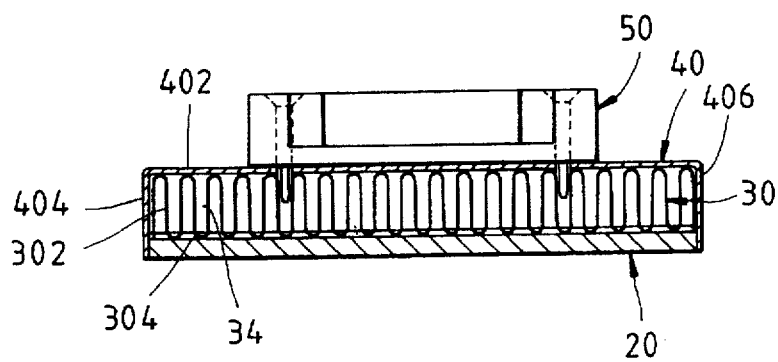
FIG. 3 shows a sectional view of a portion taken along the direction indicated by a line 3—3 as shown in FIG. 1.
Figure 4:
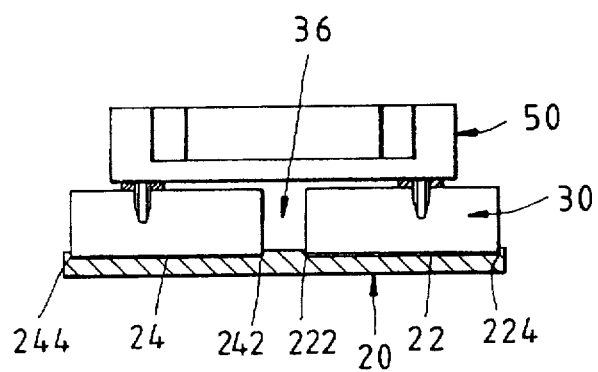
FIG. 4 shows a sectional view of a portion taken along the direction indicated by a line 4—4 as shown in FIG. 1.
Figure 2:
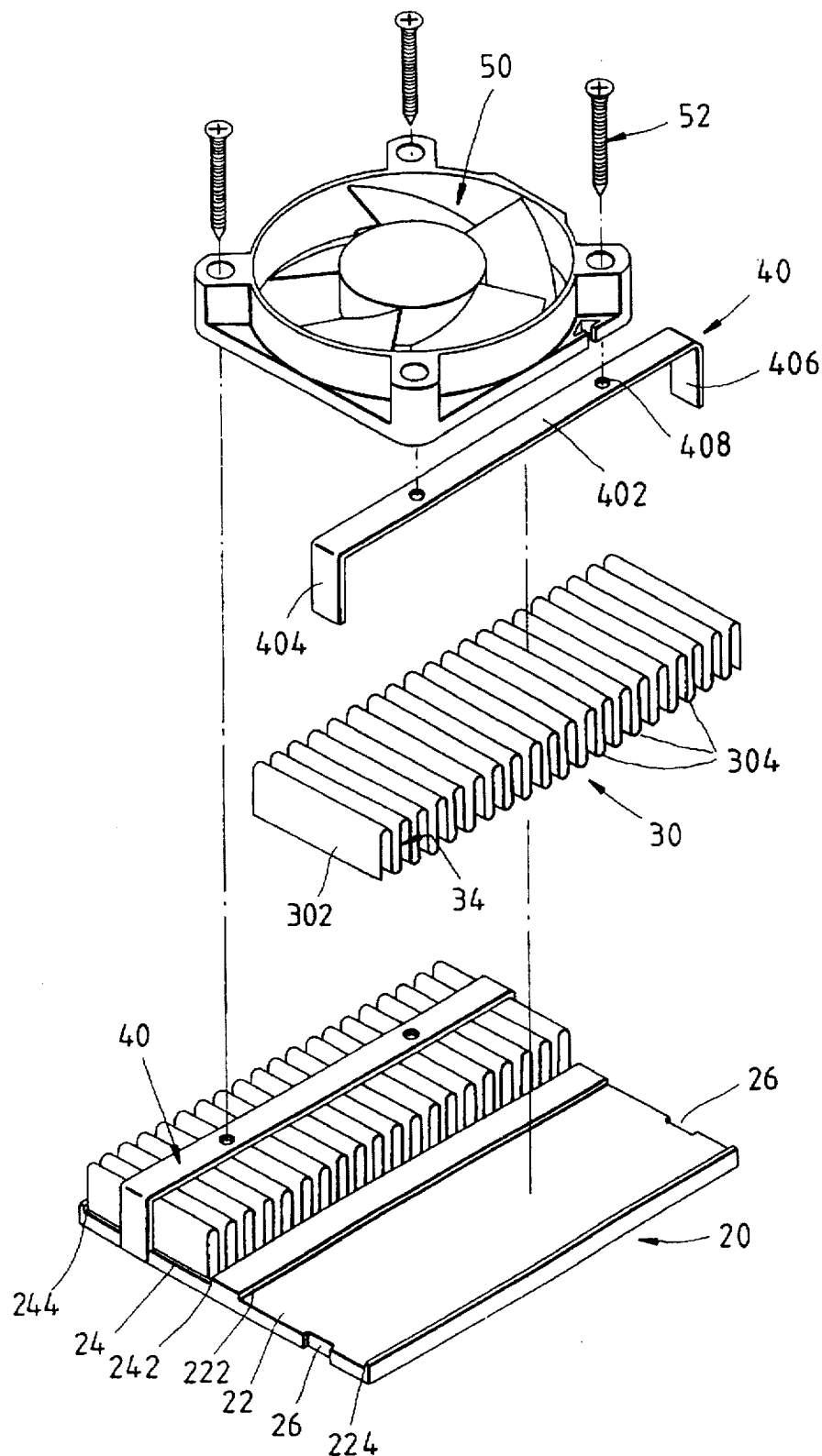
FIG. 2 shows an exploded view of the cooling apparatus of the first preferred embodiment of the present invention.

As shown in FIGS. 1–4, a cooling apparatus 10 of the first preferred embodiment of the present invention is intended for use in the central processing unit (CPU) of a computer system. The cooling apparatus 10 is fastened with a computer chip by means of a plastic frame 12 (indicated by the imaginary lines) and a retaining device 14. The cooling apparatus 10 is composed of a cooling plate 20, two cooling fins 30, two fastening frames 40 of an inverted U-shaped construction, and a cooling fan 50.

The cooling plate 20 of a rectangular construction is made of an anodized aluminium alloy plate and is provided with two recesses 22 and 24 which are separated from each other by a predetermined distance such that they extend respectively and vertically from one short side of the cooling plate 20 to another short side of the cooling plate 20. The cooling plate 20 is provided along the direction of a long side thereof with two inner arresting edges 222 and 242, and two outer arresting edges 224 and 244. The cooling plate 20 is fastened with the computer chip such that the underside of the cooling plate 20 is in contact with the computer chip for absorbing the heat generated by the computer chip in operation.

Each of two cooling fins 30 of a corrugated construction is made of an anodized aluminium alloy thin piece and is made up of a plurality of ridges 302. Located between two adjacent ridges 302 is a first cooling duct 34 perpendicular to the longitudinal axis of the cooling fin 30. Two cooling fins 30 are joined with the cooling plate 20 such that two cooling fins 30 are respectively secured to the recesses 22 and 24 of the cooling plate 20, and that apexes 304 of the ridges 302 are attached to the bottom surfaces of the recesses 22 and 24 by welding or gluing. First cooling ducts 34 are perpendicular to the long sides of the cooling plate 20. Located between two cooling fins 30 is a second cooling duct 36 parallel to the long sides of the cooling plate 20. In order to enable the cooling fins 30 to be secured to the recesses 22 and 24, it is suggested that the width of the recess 22 or 24 is slightly smaller than the width of the cooling fins 30 so as to allow both ends of the each cooling fin 30 to press against the inner and the outer arresting edges.

Each of two fastening frames 40 is made of an anodized aluminium alloy and is composed of a horizontal arm 402, and two vertical arms 404 and 406 extending from both ends of the horizontal arm 402 in the same direction. The horizontal arm 402 has a length slightly smaller than the length of the cooling plate 20. In combination, each fastening frame 40 is fastened with the cooling plate 20 such that the underside of the horizontal arm 402 of the fastening frame 40 is in contact with the top of the cooling fin 30, and that the vertical arms 404 and 406, which are slightly elastic, are held securely by two opposite sides of the longitudinal axis of the cooling fin, and further that both ends of the vertical arms 404 and 406 are engaged securely with the retaining recesses 26 of two short sides of the cooling plate 20.

The cooling fan 50 of an axial flow type is mounted on the fastening frame 40 by means of a plurality of bolts 52 engageable with the threaded holes 408 of the horizontal arm 402 of the fastening frame 40. The cooling fan 50 is located immediately over the cooling fins 30 such that the air current generated by the cooling fan 50 is directed toward the cooling fins 30.

The cooling apparatus 10 of the present invention described above is provided with a number of first cooling ducts 34 and one second cooling duct 36 which is different in orientation from first cooling ducts 34, so as to enable the air current generated by the cooling fan 50 to disperse in all directions, as indicated by arrows in FIG. 1, for maximizing the cooling efficiency of the cooling apparatus 10 of the present invention. Another unique feature of the present invention is that the cooling apparatus 10 comprises two or more fastening frames 40 by means of which the cooling fins 30 are held securely on the cooling plate 20 such that the cooling fins 30 are protected from the weight of the cooling fan 50 which is mounted on the fastening frames 40.

Figure 5:
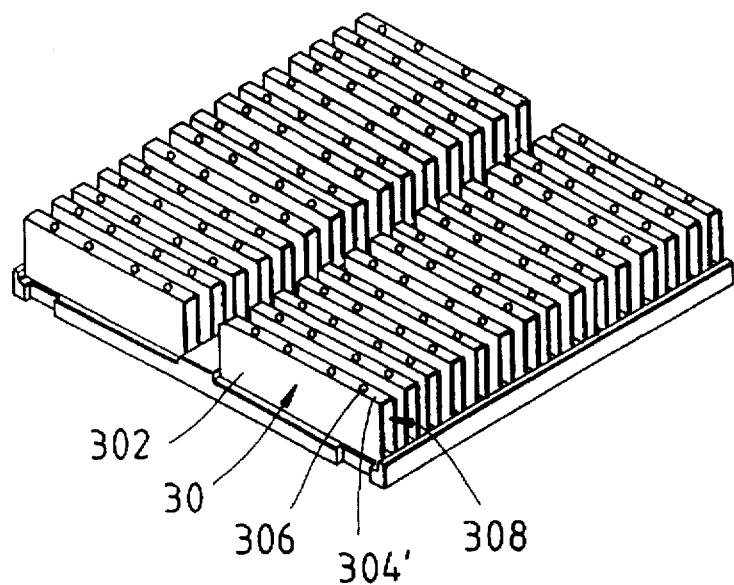
FIG. 5 is a partial perspective view of a second preferred embodiment in combination according to the present invention.
Figure 6:
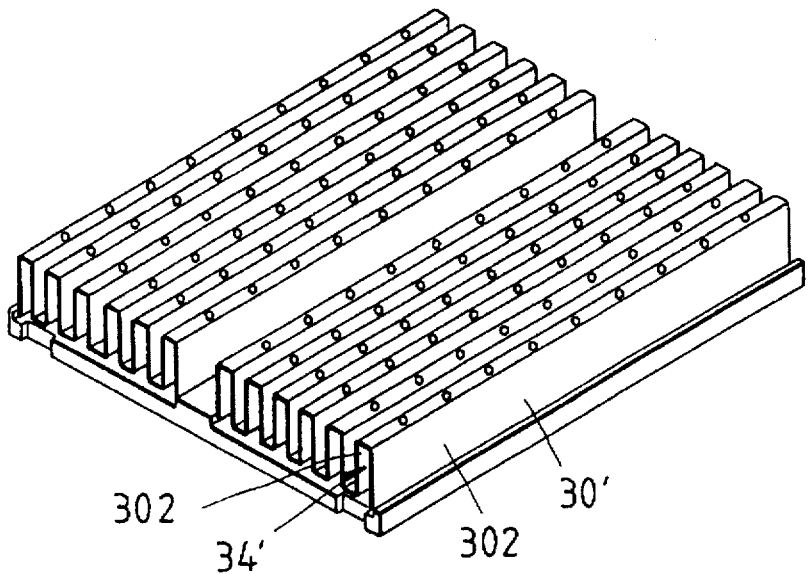
FIG. 6 is a partial perspective view of a third preferred embodiment in combination according to the present invention.

The embodiment of the present invention described above is to be regarded in all respects as merely illustrative and not restrictive. Accordingly, the present invention may be embodied in other specific forms without deviating from the spirit thereof. For example, the cooling fin 30 may be provided with a plurality of ridges 302 having a flat apex 304', as shown in FIG. 5. In addition, the flat apexes 304' of the ridges 302 are provided respectively with a plurality of cooling holes 306 which are separated from one another by a predetermined interval. The cooling holes 306 are intended to facilitate the flow of the air current in all directions via a ventilation duct 308. Moreover, the cooling apparatus 10 of the present invention may be modified such that the cooling fin 30' is provided with a plurality of first cooling ducts 34' which are parallel to the longitudinal axis of the cooling fin 30', as shown in FIG. 6.

What is claimed is:

1. A CPU cooling apparatus comprising:
   a rectangular cooling plate made of a material having a relatively high thermal conductivity, said cooling plate being attached in one surface thereof to a surface of an integrated circuit chip for absorbing heat generated by said chip in operation; and
   a least two corrugated cooling fins made of a material having an excellent cooling property said cooling fins being mounted on another surface of said cooling plate such that said cooling fins are parallel to each other, said cooling fins provided respectively with a plurality of first cooling ducts contiguous to one another and perpendicular to a longitudinal axis of said cooling fins, said cooling fins further provided therebetween with a second cooling duct,
   wherein said second cooling duct is perpendicular to said first cooling duct,
   wherein said corrugated cooling fins comprise respectively plurality of ridges having a flat apex,
   wherein said flat apex is provided with a plurality of cooling holes separated from one another at a predetermined interval.

2. The CPU cooling apparatus as defined in claim 1, wherein said cooling plate is provided in an upper surface thereof with a plurality of recesses separated from one another at a predetermined interval such that said recesses are parallel to one side of said cooling plate, and that said recesses correspond in dimension to said cooling fins for locating said cooling fins on said cooling plate.

3. The CPU cooling apparatus as defined in claim 1 further comprising a plurality of elastic fastening frames of an inverted U-shaped construction, said fastening frames comprising a horizontal arm and two vertical arms fastened with both ends of said horizontal arm such that said vertical arms are perpendicular to a longitudinal axis of said horizontal arm, said fastening frames being fastened with said cooling plate such that an underside of said horizontal arm is in contact with a top of each of said cooling fins, and that said two vertical arms are retained by both end surfaces of a longitudinal axis of said cooling fins, and further that a free end of each of said vertical arms is fastened with one side of said cooling plate.

4. The CPU cooling apparatus as defined in claim 3 wherein said one side of said cooling plate is provided with a retaining recess engageable with said free end of said vertical arms.

5. The CPU cooling apparatus as defined in claim 3, further comprising a cooling fan located immediately over said cooling fins and mounted on said horizontal arm of each of said fastening frames.

6. The CPU cooling apparatus as defined in claim 5, wherein said horizontal arm has a plurality of threaded holes engageable with fastening bolts for mounting said cooling fan on said horizontal arm.

7. A CPU cooling apparatus comprising:
   an electrically-insulated metal cooling plate of a rectangular construction and having an underside which is attached to one surface of an integrated circuit chip for absorbing heat generated by said chip in operation; and
   two electrically-insulated metal cooling fins of a corrugated construction and mounted on an upper surface of said cooling plate such that said cooling fins are parallel to each other;
   wherein said upper surface of said cooling plate is provided with two recesses which are separated from each other at a predetermined interval such that said recesses extend from one side of said cooling plate to another side opposite to said one side of said cooling plate, said cooling plate further provided with an inner arresting edge and an outer arresting edge;

wherein said cooling fins have a plurality of cooling ducts contiguous to one another and are received in said recesses such that two sides of each of said cooling fins are pressed against an inner side and an outer side of each of said recesses.

8. The CPU cooling apparatus as defined in claim 7, wherein said cooling fins have a plurality of ridges having a flat apex.

9. The CPU cooling apparatus as defined in claim 8, wherein said flat apex is provided with a plurality of cooling holes separated from one another at a predetermined interval.

10. The CPU cooling apparatus defined in claim 7 further comprising two fastening frames of an inverted U-shaped construction, said fastening frames comprising a horizontal arm and two vertical arms fastened with both ends of said horizontal arm such that said vertical arms are perpendicular to a longitudinal axis of said horizontal arm, said fastening flames being fastened with said cooling plate such that an underside of said horizontal arm is in contact with a top of each of said cooling fins, and that said vertical arms are retained by both end surfaces of a longitudinal axis of said cooling fins, and further that a free end of each of said vertical arms is fastened with one side of said cooling plate.

11. The CPU cooling apparatus as defined in claim 7, wherein said one side of said cooling plate is provided with a retaining recess engageable with said free end of said vertical arms.

12. The CPU cooling apparatus as defined in claim 10 further comprising a cooling fan located immediately over said cooling fins and mounted on said horizontal arm of each of said fastening frames.

13. The CPU cooling apparatus as defined in claim 12, wherein said horizontal arm has a plurality of threaded holes engageable with fastening bolts for mounting said cooling fan on said horizontal arm.

* * * * *